United States Patent
Chen

(12) 
(10) Patent No.: US 6,618,130 B2
(45) Date of Patent: Sep. 9, 2003

(54) METHOD AND APPARATUS FOR OPTICAL ENDPOINT DETECTION DURING CHEMICAL MECHANICAL POLISHING

(75) Inventor: Charles Chen, Sunnyvale, CA (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/941,109

(22) Filed: Aug. 28, 2001

(65) Prior Publication Data

US 2003/0053042 A1 Mar. 20, 2003

(51) Int. Cl.⁷ .......................... G01N 21/00; G01N 21/55
(52) U.S. Cl. .......................................... 356/73; 356/445
(58) Field of Search ............................ 356/72, 73, 381, 356/382, 630; 250/559.27, 559.28; 451/5, 6, 307, 41, 63, 89, 285–288, 296, 299

(56) References Cited

U.S. PATENT DOCUMENTS

| | | | |
|---|---|---|---|
| 5,160,402 A | 11/1992 | Cheng | |
| 5,949,927 A | 9/1999 | Tang | |
| 6,010,538 A | 1/2000 | Sun et al. | |
| 6,024,628 A | 2/2000 | Chen | |
| 6,071,177 A | 6/2000 | Lin et al. | |
| 6,074,287 A | 6/2000 | Miyaji et al. | |
| 6,106,662 A | 8/2000 | Bibby, Jr. et al. | |
| 6,111,634 A | * 8/2000 | Pecen et al. | 356/72 |
| 6,191,864 B1 | * 2/2001 | Sandhu | 356/503 |
| 6,204,922 B1 | * 3/2001 | Chalmers | 356/630 |
| 6,290,572 B1 | * 9/2001 | Hofmann | 451/5 |
| 6,358,362 B1 | * 3/2002 | En et al. | 156/345.13 |
| 6,361,646 B1 | * 3/2002 | Bibby, Jr. et al. | 216/85 |
| 6,451,700 B1 | * 9/2002 | Stirton et al. | 438/695 |
| 6,476,921 B1 | * 11/2002 | Saka et al. | 356/630 |
| 6,511,363 B2 | * 1/2003 | Yamane et al. | 451/6 |

* cited by examiner

*Primary Examiner*—Michael P. Stafira
(74) *Attorney, Agent, or Firm*—Snell & Wilmer, L.L.P.

(57) ABSTRACT

A method for detecting during a planarization process the removal of a first layer of material overlying a workpiece is provided. Relative motion is effected between the first layer and a working surface to remove the first layer. A light having a spectrum of wavelengths is transmitted to the workpiece. The intensity for each of a plurality of reflected wavelengths of a reflected light reflected from the workpiece is measured to obtain a spectrum. The spectrum is a function of the plurality of reflective wavelengths. A spectrum reference value is calculated and a plurality of spectrum difference values are calculated by subtracting the spectrum reference value from the spectrum. An absolute value for each of the plurality of spectrum difference values that is a function of one of the plurality of reflected wavelengths that falls within a selected range of wavelengths is summed together to obtain a delta value. An endpoint parameter is calculated from the delta value.

17 Claims, 3 Drawing Sheets

METHOD AND APPARATUS FOR OPTICAL ENDPOINT DETECTION DURING CHEMICAL MECHANICAL POLISHING

FIELD OF THE INVENTION

The present invention generally relates to chemical mechanical planarization, and more particularly to a method and apparatus for determining the endpoint of a planarization process.

BACKGROUND

Chemical mechanical planarization (CMP) is now common in the manufacturing process of semiconductors. Semiconductors are constructed of multiple layers of material deposited on a wafer. CMP may be used throughout the manufacturing process of semiconductors to planarize the various layers of material deposited on the wafer or to remove the various layers entirely. For example, CMP may be used to remove a layer of metal, such as copper, that previously had been deposited on the wafer to form interconnects.

CMP is generally accomplished by pressing a surface of the wafer against a polishing pad attached to a rotating or orbiting platen in the presence of slurry. During the planarization process, it is desirable to gather data on the condition of the wafer's surface. The data may then be used to optimize the planarization process or to determine when the planarization process should be terminated (referred to as "endpoint"), for example, when a metal layer has been substantially removed from the wafer. Typically, such data is collected by endpoint detection (EPD) systems.

Many users prefer EPD systems that are "in-situ" EPD systems, which provide EPD during the polishing process. One group of prior art EPD systems for detecting the endpoint during the CMP of thin films involves optical systems that use interferometric or spectrophotometric optical measurement techniques. Using these techniques, a light is directed to the wafer's surface. A reflected light is collected and the interferometric, spectrophotometric and/or other changes in the reflected light is measured to determine the endpoint. However, in CMP processes where the material removal rate is slow, the interferometric or spectrophotometric change may be slow and minimal. For example, certain low down-force copper CMP processes are designed to use slow material removal rates to achieve higher levels of surface planarization. Because of the slow removal rates, it is difficult using standard optical EPD techniques to detect the minor interferometric or spectrophotometric changes and, as a result, process endpoints are incorrectly detected.

Accordingly, there exists a need for an optical endpoint detection method and apparatus that accurately detect the endpoint of chemical mechanical planarization of thin films. A further need exists for an optical endpoint detection method and apparatus that accurately detect the endpoint of chemical mechanical planarization processes using slow removal rates.

SUMMARY OF THE INVENTION

This summary of invention section is intended to introduce the reader to aspects of the invention and is not a complete description of the invention. Particular aspects of the invention are pointed out in other sections hereinbelow, and the invention is set forth in the appended claims which alone demarcate its scope.

In accordance with an exemplary embodiment of the present invention, a method for detecting the removal of a first layer of material overlying a workpiece during a planarization process is provided. Relative motion is effected between the first layer and a working surface to remove the first layer. A light having a spectrum of wavelengths is transmitted to the workpiece. The intensity for each of a plurality of reflected wavelengths of a reflected light reflected from the workpiece is measured to obtain a spectrum. The spectrum is a function of the plurality of reflective wavelengths. A spectrum reference value is then calculated. A plurality of spectrum difference values are calculated by subtracting the spectrum reference value from the spectrum. An absolute value for each of the plurality of spectrum difference values that is a function of one of the plurality of reflected wavelengths that falls within a selected range of wavelengths is summed together to obtain a delta value. An endpoint parameter is calculated from the delta value.

In accordance with another exemplary embodiment of the present invention, an apparatus for detecting the removal of a first layer of material overlying a workpiece during a chemical mechanical planarization process is also provided. The apparatus includes a light-illuminating assembly for transmitting light to the workpiece during one of a plurality of scan cycles. A light-receiving assembly receives a reflected light reflected from the workpiece during the scan cycle. A processor is operatively connected to the light-receiving assembly and is configured to measure an intensity for each of a plurality of reflected wavelengths of the reflected light to obtain a spectrum. The spectrum is a function of the plurality of reflected wavelengths. The processor is also configured to calculate a reference spectrum value and calculate a plurality of spectrum. Each of the calculated spectrum difference values is a function of one of the plurality of reflected wavelengths. The processor is further configured to sum together absolute values of each of the plurality of spectrum difference values that is a function of one of the plurality of reflected wavelengths that falls within a selected range of wavelengths to obtain a delta value therefrom. The processor is programmed to calculate an endpoint parameter from the delta value.

These and other aspects of the present invention are described in the following description, claims and appended drawings.

BRIEF DESCRIPTION OF THE DRAWINGS

Exemplary embodiments of the present invention will hereafter be described in conjunction with the appended drawing figures, wherein like designations denote like elements, and.

DETAILED DESCRIPTION OF THE INVENTION

The following description is of exemplary embodiments only and is not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
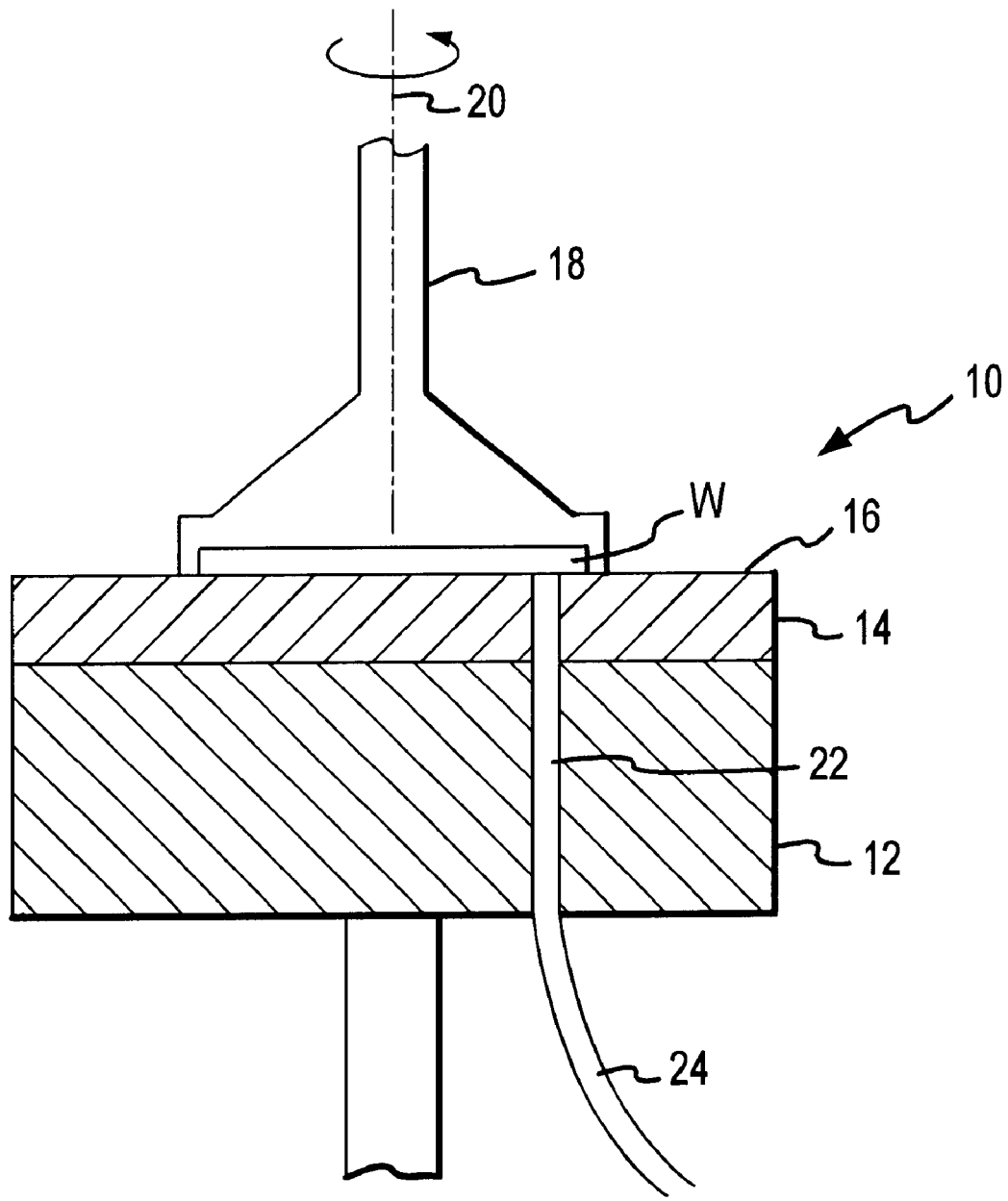
FIG. 1 is a schematic illustration of a polishing station of a CMP apparatus available in the prior art.
Figure 2:
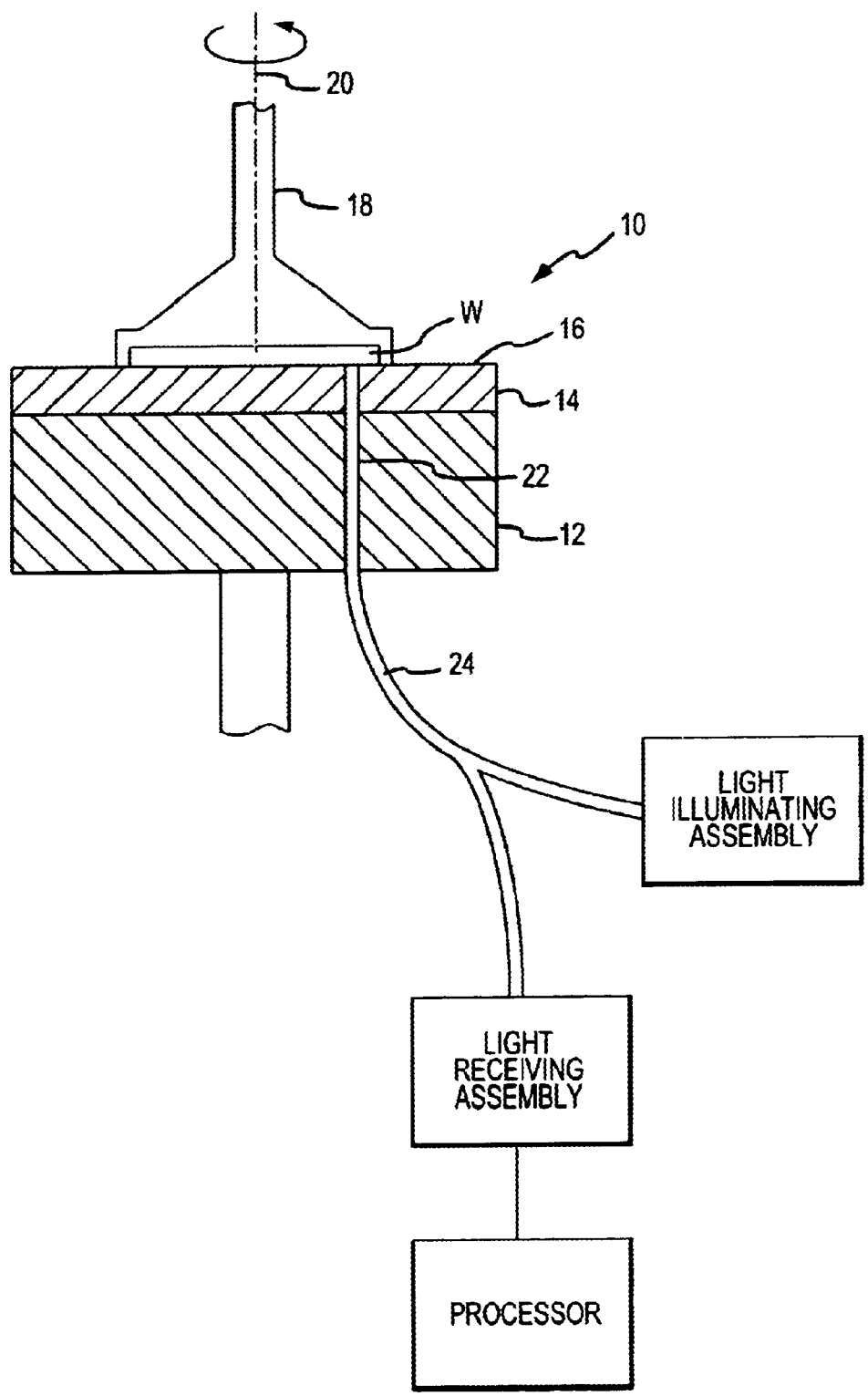
FIG. 2 is a schematic illustration of a CMP apparatus in accordance with the present invention.
Figure 3:
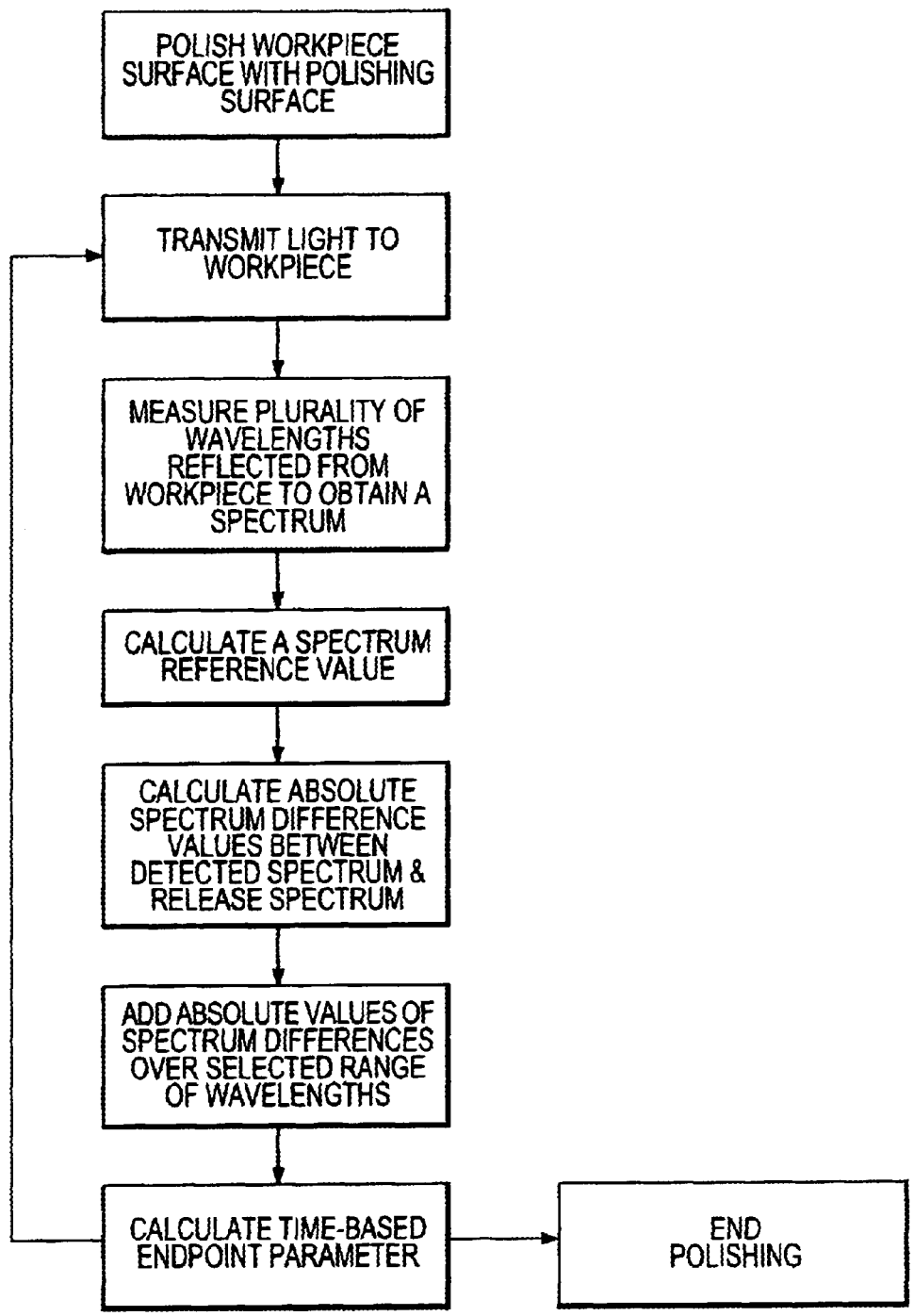
FIG. 3 is a block diagram showing the method of the present invention.

A schematic representation of a polishing station 10 of a typical CMP apparatus with an in-situ EPD system is shown in FIG. 1. Polishing station 10 includes a polishing platen 12 mounted for motion by a drive motor (not shown). A polishing pad 14 with a polishing surface 16 is mounted to polishing platen 12.

During planarization, a workpiece W is held by a workpiece carrier 18, which urges the workpiece against polishing pad 14 with a desired amount of force. Workpiece W may be rotated by workpiece carrier 18 about an axis 20. Alternatively, workpiece carrier 18 may move workpiece W in an orbital or lateral pattern. Workpiece carrier 18 advances the workpiece toward polishing pad 14 and applies pressure such that the workpiece engages the polishing surface 16 of the polishing pad 14 with a desired amount of force while the polishing platen moves the polishing pad in an orbital, lateral or rotational pattern.

A typical in-situ optical endpoint system for use with a CMP apparatus is also illustrated in FIG. 1. At least one optical probe 22 is inserted through a bore in platen 12 and through a through-hole in pad 14 so that the distal tip of the probe is flush or slightly below polishing surface 16 of polishing pad 14. The optical probe includes a light source and a sensor, such as a spectrometer. The light source generates a light beam which impinges on the exposed surface of the workpiece W. The light source is a broadband light source, preferably with a spectrum of light between 200 and 1000 nm in wavelength, and more preferably with a spectrum of light between 400 and 900 nm in wavelength. The sensor receives light reflected back from the surface of the workpiece W at various wavelengths and intensities. The light source and sensor may be connected to a general purpose programmable digital computer or processor (not shown) via a suitable connection 24. The processor may be programmed to receive data from the sensor for each point of the workpiece that is scanned, to store wavelength and intensity measurements from the sensor for each point of the workpiece that is scanned, to calculate endpoint parameters for each point and to detect the planarization endpoint.

In accordance with one embodiment of the present invention, the endpoint detection system is a spectra reflectometer-based optical system, such as the system described above with reference to FIG. 1. The system includes at least one light-emitting assembly that transmits light to a point on the workpiece and at least one light-receiving assembly that receives light reflected back from the workpiece. Because the endpoint detection system moves relative to the workpiece, it is operable to transmit light to and receive reflected light back from "n" number of points on the workpiece to obtain "n" number of reflected spectral data points, hereinafter referred to as a "spectrum." The transmission of light to a point on the workpiece and receipt of light reflected back from the workpiece comprises a "scan of cycle." Accordingly, the variable "n" represents the scan cycle number from the beginning of endpoint detection. The variable "n" may be converted to a time variable representing the time that has elapsed from the beginning of detection by dividing the scan cycle number by the data sampling rate. For purposes of example only, if the scan cycle rate is 100 data points/second, the fifth scan cycle will have been taken 0.005 seconds from the beginning of detection.

Each spectrum may be represented by a function "f(n,λ)" that relates to a reflectivity characteristic of the material of the workpiece that reflects the light transmitted from the light-emitting assembly. For example, a spectrum resulting from light reflected by a copper layer of the workpiece will be different from a spectrum resulting from light reflected by a dielectric material of the workpiece. The spectrum is a function of the wavelength "λ" of reflected light received back from the material on the workpiece at the "n" scan cycle. Accordingly, for every "nth" scan cycle, a single spectrum, which represents intensities of the light reflected back from the workpiece at a plurality of wavelengths, is measured and calculated by the processor.

The method of the present invention for determining an endpoint of a planarization process includes calculating an absolute value of a spectrum difference between a detected spectrum and a reference spectrum for each wavelength reflected back from a point on the workpiece, summing the absolute values of the spectrum differences over a selected range of wavelengths, and calculating a time-based endpoint parameter therefrom. The process is repeated so that a computer or user can monitor the planarization process. A significant change in the endpoint parameters over a given time may then be used to indicate the endpoint of the planarization process. In addition, a derivative of each endpoint parameter with respect to time may be calculated. For CMP processes in which a metal material layer is removed, the endpoint is reached when the calculated first derivatives of the endpoint parameters reach a peak. The above method for calculating the endpoint parameter will now be described more fully.

At commencement of a planarization process, relative movement between a workpiece and a working surface, such as the surface of a polishing pad, is effected, such as by rotating and/or orbiting the working surface and/or the workpiece. A planarization fluid, such as an abrasive slurry, may be delivered to the working surface to facilitate planarization. The light-emitting assembly of the system transmits light to the workpiece and the light-receiving assembly receives light reflected by material on the surface of the workpiece. At the start of planarization, the planarization process may not yet be stable. Accordingly, it is preferable that the endpoint detection apparatus does not calculate endpoint parameters until the planarization process has stabilized, typically the first few seconds after planarization begins. Once the planarization process becomes stable, a reference spectrum is calculated by the processor according to the following equation:

$$R(\lambda) = \sum_{n=N_S+1}^{N_S+N_R} f(n, \lambda)/N_R,$$

where $N_S$ is a scan cycle number after the process has stabilized and $N_R$ is the desired number of scan cycles used for calculating the reference spectrum. It will be appreciated that, alternatively, the endpoint detection system may be activated after the planarization process becomes stable, in which case $N_S$ will be 1.

Once the reference spectrum is calculated, a spectrum difference value "D(n,λ)" for each scan cycle may be calculated according to the equation:

$$D(n,\lambda) = f(n,\lambda) - R(\lambda), \text{ where } n > N_S + N_R.$$

A desired window of wavelengths then may be selected to expedite endpoint parameter calculations and a delta value "Δ(n)" may be calculated for each scan cycle according to the equation:

$$\Delta(n) = a \times \sum_{\lambda=\lambda_L}^{\lambda_U} |D(n, \lambda)|,$$

where $\lambda_U$ is the upper wavelength limit of the wavelength window and $\lambda_L$ is the lower wavelength limit of the wavelength window. The window of wavelengths may be selected based on a material's increased ability to reflect light at those wavelengths. For example, if a material to be removed from the workpiece readily reflects light at wavelengths of about 400 to 600 nm, by restricting calculations of the delta values to a restricted window of wavelengths of about 400 to 600 nm, endpoint detection can be expedited without a loss of calculation accuracy. The coefficient "a" may be 1 or may be a numeral used for suitably scaling the equation for display purposes.

Because the difference between delta values calculated for two successive scan cycles may be small enough so as to be overlooked during endpoint detection, it is preferable to calculate the variable gain of the delta value so as to amplify the difference therebetween. Accordingly, an endpoint parameter EP(n) may be calculated for each scan cycle according to the following equation:

$$EP(n) = b \times exp(\Delta(n)),$$

where "b" is a coefficient that may be 1 or may be a numeral used for suitably scaling the equation for display purposes. The endpoint of a particular planarization process may be determined based on the differences between the endpoint parameters of successive scan cycles.

An additional endpoint detection mechanism includes calculating a first derivative ("EPD") of the endpoint parameter per scan cycle. The first derivative is representative of the rate of change of the endpoint parameter. For removal of metal layers by CMP processing, the endpoint of the process may be detected at the point where the first derivative value reaches a peak. The first derivative of the endpoint parameter is calculated by the following equation:

$$EPD(n) = c \times d(EP(n))/d(n),$$

where "c" is a coefficient that may be 1 or may be a numeral used for suitably scaling the equation for display purposes. The endpoint of a particular planarization process may be determined based on the differences between the first derivatives of the endpoint parameters of successive scan cycles. Alternatively, the endpoint of a particular planarization process may also be determined based on a combination of the differences between the endpoint parameters of successive scan cycles and the differences between the first derivatives of the endpoints of successive scan cycles.

In the foregoing specification, the EPD system and method of the present invention have been described with reference to specific embodiments. However, one of ordinary skill in the art appreciates that various modifications and changes can be made with our departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, solution to occur or become more pronounced are not to be construed as critical, required, or essential features or elements of any or all of the claims. As used, herein the terms "comprises," "comprising" or any other variation thereof, are intended to cover a non-exclusive inclusion, such that a process, method, article, or apparatus that comprises a list of elements does not include only those elements but may include other elements not expressly listed or inherent to such process, method, article, or apparatus.

I claim:

1. A method for detecting, during a planarization process, the removal of a first layer of material overlying a workpiece said method comprising:
    (a) causing relative motion between said first layer and a working surface to remove said first layer;
    (b) during said causing relative motion, transmitting to said workpiece a light having a spectrum of wavelengths;
    (c) measuring an intensity for each of a plurality of reflected wavelengths of a reflected light reflected from said workpiece to obtain a spectrum, wherein said spectrum is a function of said plurality of reflected wavelengths;
    (d) calculating a reference spectrum;
    (e) calculating a plurality of spectrum difference values by subtracting said reference spectrum from said spectrum, wherein each of said spectrum difference values is a function of one of said plurality of reflected wavelengths;
    (f) selecting a range of wavelengths;
    (g) summing together an absolute value for each of said plurality of spectrum difference values that is a function of one of said plurality of reflected wavelengths that falls within said range of wavelengths to obtain a delta value therefrom; and
    (h) calculating an endpoint parameter from the delta value.

2. The method of claim 1, wherein said transmitting and said measuring comprise a scan cycle.

3. The method of claim 2, further comprising:
    (i) repeating (b) through (h) to effect a plurality of scan cycles to obtain a plurality of endpoint parameters, wherein each of said plurality of endpoint parameters corresponds to one of said plurality of scan cycles.

4. The method of claim 3, further comprising terminating said planarization process when said plurality of endpoint parameters indicates that said first layer has been substantially removed from said workpiece.

5. The method of claim 3, further comprising:
    (j) for each endpoint parameter calculated, calculating a first derivative of said endpoint parameter to obtain a plurality of first derivatives; and
    (k) terminating said planarization process when said plurality of first derivatives indicates that said first layer has been substantially removed from said workpiece.

6. The method of claim 3, wherein said spectrum reference value may be derived from:

$$R(\lambda) = \sum_{n=N_S+1}^{N_S+N_R} f(n, \lambda)/N_R,$$

wherein:
    n represents a number of a scan cycle;
    $N_S$ represents a number of a scan cycle when said planarization process becomes stable;

$N_R$ represents a predetermined number of scan cycles to be used for calculating said spectrum reference value;

λ represents one of said plurality of reflected wavelengths of said reflected light; and f(n,λ) represents said spectrum, wherein said spectrum is a function of said plurality of reflected wavelengths of said reflected light measured during an "n" scan cycle.

7. The method of claim 3, wherein each of said plurality of spectrum difference values may be derived from:

$$D(n,\lambda)=f(n,\lambda)-R(\lambda)$$

wherein:

n represents a number of a scan cycle;

n is greater than a sum ($N_S+N_R$);

$N_S$ represents a number of a scan cycle when said planarization process becomes stable;

$N_R$ represents a predetermined number of scan cycles to be used for calculating said spectrum reference value;

λ represents one of said plurality of reflected wavelengths of said reflected light;

f(n,λ) represents said spectrum, wherein said spectrum is a function of said plurality of reflected wavelengths of said reflected light measured during an "n" scan cycle; and R(λ) represents said reference spectrum value.

8. The method of claim 3, wherein said delta value may be derived from:

$$\Delta(n) = a \times \sum_{\lambda=\lambda_L}^{\lambda_U} |D(n,\lambda)|$$

wherein:

n represents a number of a scan cycle;

λ represents one of said plurality of reflected wavelengths of said reflected light;

D(n,λ) represents said plurality of spectrum difference values for an "n" scan cycle;

$\lambda_U$ represents an upper wavelength limit of said range of wavelengths;

$\lambda_L$ represents a lower wavelength limit of said range of wavelengths; and a represents a coefficient.

9. The method of claim 3, wherein said endpoint parameter may be derived from:

$$EP(n)=b \times exp(\Delta(n))$$

wherein:

n represents a number of a scan cycle;

Δ(n) represents said delta value for an "n" scan cycle; and b represents a coefficient.

10. The method of claim 5, wherein said first derivative may be derived from:

$$EPD(n)=c \times d(EP(n))/d(n)$$

wherein:

n represents a number of a scan cycle;

EP(n) represents said endpoint parameter for an "n" scan cycle; and c represents a coefficient.

11. An apparatus for detecting the removal of a first layer of material overlying a workpiece during a chemical mechanical planarization process, said apparatus comprising:

a light-illuminating assembly for transmitting light to the workpiece;

a light-receiving assembly for receiving a reflected light reflected from the workpiece during one of a plurality of scan cycles;

a processor operatively connected to said light-receiving assembly and configured to:

measure an intensity for each of a plurality of reflected wavelengths of said reflected light reflected from said workpiece during said one of a plurality of scan cycles to obtain a spectrum, wherein said spectrum is a function of said plurality of reflected wavelengths;

calculate a reference spectrum value;

calculate a plurality of spectrum difference values by subtracting said reference spectrum from said spectrum, wherein each of said spectrum difference values is a function of one of said plurality of reflected wavelengths;

sum together an absolute value of each of said plurality of spectrum difference values that is a function of one of said plurality of reflected wavelengths that falls within a selected range of wavelengths to obtain a delta value therefrom; and calculate an endpoint parameter from said delta value.

12. The apparatus of claim 11, wherein said processor is configured to calculate said spectrum reference value from the equation, $$R(\lambda) = \sum_{n=N_S+1}^{N_S+N_R} f(n,\lambda)/N_R$$

wherein:

n represents a number of a scan cycle;

$N_S$ represents a number of a scan cycle when said planarization process becomes stable;

$N_R$ represents a predetermined number of scan cycles to be used for calculating said spectrum reference value;

λ represents one of said plurality of reflected wavelengths of said reflected light; and f(n,λ) represents said spectrum, wherein said spectrum is a function of said plurality of reflected wavelengths measured during an "n" scan cycle.

13. The apparatus of claim 11, wherein said processor is configured to calculate said plurality of spectrum difference values from the equation:

$$D(n,\lambda)=f(n,\lambda)-R(\lambda),$$

wherein:

n represents a number of a scan cycle;

n is greater than a sum ($N_S+N_R$);

$N_S$ represents a number of a scan cycle when said planarization process becomes stable;

$N_R$ represents a predetermined number of scan cycles to be used for calculating said spectrum reference value;

λ represents one of said plurality of reflected wavelengths of said reflected light;

f(n,λ) represents said spectrum, wherein said spectrum is a function of said plurality of reflected wavelengths of said reflected light measured during an "n" scan cycle; and R(λ) represents said reference spectrum value.

14. The apparatus of claim 11, wherein said processor is configured to calculate said delta value from the equation:

$$\Delta(n) = a \times \sum_{\lambda=\lambda_L}^{\lambda_U} |D(n,\lambda)|,$$

wherein:

n represents a number of a scan cycle;

$\lambda$ represents one of said plurality of reflected wavelengths of said reflected light;

$D(n,\lambda)$ represents said plurality of spectrum difference values for an "n" scan cycle;

$\lambda_U$ represents an upper wavelength limit of said range of wavelengths;

$\lambda_L$ represents a lower wavelength limit of said range of wavelengths; and a represents a coefficient.

15. The apparatus of claim 11, wherein said processor is configured to calculate said endpoint parameter from the equation:

$$EP(n) = b \times exp(\Delta(n)),$$

wherein:

n represents a number of a scan cycle;

$\Delta(n)$ represents said delta value for an "n" scan cycle; and b represents a coefficient.

16. The apparatus of claim 11, wherein said processor is configured to calculate a first derivative of said endpoint parameter.

17. The apparatus of claim 16, wherein said processor is configured to calculate said first derivative from the equation:

$$EPD(n) = c \times d(EP(n))/d(n)$$

wherein:

n represents a number of a scan cycle;

EP(n) represents said endpoint parameter for an "n" scan cycle; and c represents a coefficient.

* * * * *